(12) United States Patent
Onuma (10) Patent No.: US 11,632,131 B2
(45) Date of Patent: Apr. 18, 2023

(54) ERROR RATE MEASURING APPARATUS AND CODEWORD ERROR DISPLAY METHOD

(71) Applicant: ANRITSU CORPORATION, Kanagawa (JP)

(72) Inventor: Hiroyuki Onuma, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 17/659,924

(22) Filed: Apr. 20, 2022

(65) Prior Publication Data

US 2023/0069842 A1 Mar. 9, 2023

(30) Foreign Application Priority Data

Sep. 8, 2021 (JP) .............................. JP2021-146176

(51) Int. Cl.
*H03M 13/00* (2006.01)
*H03M 13/11* (2006.01)

(52) U.S. Cl.
CPC ...... *H03M 13/1105* (2013.01); *H03M 13/611* (2013.01)

(58) Field of Classification Search
CPC .. H03M 13/09; H03M 13/43; H03M 13/1111; H03M 13/458; H03M 13/05; G01R 31/3171; G01R 31/31905; G01R 31/3177
See application file for complete search history.

(56) References Cited

U.S. PATENT DOCUMENTS

| | | | | |
|---|---|---|---|---|
| 6,314,535 | B1* | 11/2001 | Morris | H04L 1/0009 370/468 |
| 7,739,558 | B1* | 6/2010 | Farjadrad | H03M 13/015 714/704 |
| 8,578,221 | B1* | 11/2013 | Ikoma | H04L 1/203 714/707 |
| 2006/0143549 | A1* | 6/2006 | Yasumoto | H04L 1/244 714/704 |
| 2007/0254643 | A1* | 11/2007 | Garcia | H04L 1/20 455/423 |
| 2012/0072802 | A1* | 3/2012 | Chinnici | H04L 1/20 714/752 |
| 2013/0091383 | A1* | 4/2013 | Masser | G06F 11/3688 714/E11.178 |

FOREIGN PATENT DOCUMENTS

JP 2007-274474 A 10/2007

* cited by examiner

*Primary Examiner* — Esaw T Abraham
(74) *Attorney, Agent, or Firm* — Pearne & Gordon, LLP (57) ABSTRACT

An error rate measuring apparatus includes: an operation unit that sets a codeword length, an FEC symbol length, and an FEC symbol error threshold in accordance with a communication standard of a device under test W; error counting means for counting FEC symbol error detected at one FEC symbol interval and an uncorrectable codeword; a display unit that identifies and displays bit string data according to presence or absence of the FEC symbol error in FEC symbol length units based on a counting result; and display control means for performing display control by setting one zone of a display area of identification display as one FEC symbol length, matching a zone length of a horizontal axis of the display area with one codeword length, and performing line feed in codeword length units.

8 Claims, 5 Drawing Sheets

ERROR RATE MEASURING APPARATUS AND CODEWORD ERROR DISPLAY METHOD

TECHNICAL FIELD

The present invention relates to an error rate measuring apparatus that transmits a known pattern (non return to zero (NRZ) signal or pulse amplitude modulation 4 (PAM4) signal) as a test signal to a device under test in a state in which the device under test has transited to a state of a signal pattern return and measures a bit error rate of input data returned and received from the device under test in association with the transmission of the test signal, and in particular, measures whether or not a forward error correction (FEC) operation of the device under test is possible, and a codeword error display method.

BACKGROUND ART

An error rate measuring apparatus is hitherto known as an apparatus that transmits a test signal of a known pattern including fixed data to a device under test and compares a signal under test returned and received from the device under test in compliance with the transmission of the test signal with a reference signal to be a reference in units of bits to measure a bit error rate (BER).

Further, for example, as disclosed in Patent Document 1 below, this kind of error rate measuring apparatus has an error mapping function capable of checking visual error distribution by coloring captured data for each bit or PAM4 symbol based on presence or absence (occurrence or non-occurrence) of an error.

RELATED ART DOCUMENT

Patent Document

[Patent Document 1] JP-A-2007-274474

DISCLOSURE OF THE INVENTION

Problem that the Invention is to Solve

According to the error rate measuring apparatus in Patent Document 1 described above, it is possible to display a position of a bit error in a bit pattern string; however, it is difficult to recognize the presence or absence (occurrence or non-occurrence) of an error or distribution of an error by each FEC symbol length in codeword units. That is, in a case where an error occurs in the device under test due to a specific input pattern, it is difficult to recognize where an error is likely to occur or occurrences of an uncorrectable codeword (a codeword on which forward error correction is impossible) of each codeword. Moreover, since the error rate measuring apparatus does not have a function of counting a position of uncorrectable codeword or the number of errors in uncorrectable codeword, there is a problem that debugging of the device under test cannot be performed efficiently.

That is, with the conventional error mapping function, the captured FEC symbol data cannot be separated by a codeword length based on the selected communication standard, so that an operation for determining how long one codeword is troublesome, and effort and time for the operation are required. As a result, even if the uncorrectable codeword occurs, it takes time to investigate a cause of the defect of the device under test, and there is a problem that debugging cannot be performed efficiently.

Accordingly, the present invention has been accomplished in view of the above-described problem, and an object of the present invention is to provide an error rate measuring apparatus and a codeword error display method capable of recognizing presence or absence of an error in FEC symbol length units for each codeword.

Means for Solving the Problem

To achieve the above-described object, there is provided an error rate measuring apparatus 1 according to a first aspect of the present invention that inputs a non return to zero (NRZ) signal of a known pattern as a test signal to a device under test W, receives a signal from the device under test with the input of the test signal, and measures whether or not a forward error correction (FEC) operation of the device under test is possible based on a comparison result of the received signal and the test signal. The error rate measuring apparatus includes:

an operation unit 4 that sets a codeword length of the FEC, an FEC symbol length, and an FEC symbol error threshold in accordance with a communication standard of the device under test;

error counting means 7b for counting an FEC symbol error detected at one FEC symbol interval based on a comparison result of error data and each bit of bit string data obtained by receiving and converting the signal from the device under test, and for counting the FEC symbol error as an uncorrectable codeword that is not capable of being forward error corrected when the number of the FEC symbol errors in one codeword exceeds the FEC symbol error threshold;

a display unit 6 that identifies and displays the bit string data according to presence or absence of the FEC symbol error in FEC symbol length units based on a counting result of the error counting means; and display control means 7d for performing display control by setting one zone of a display area of identification display of the display unit as one FEC symbol length, matching a length of a horizontal axis of the display area with one codeword length, and performing line feed in codeword length units so that a head of one codeword of the identification display is located at a left end of the display area and a tail of one codeword of the identification display is located at a right end of the display area.

According to a second aspect of the present invention, there is provided an error rate measuring apparatus 1 that inputs a pulse amplitude modulation (PAM4) signal of a known pattern as a test signal to a device under test W, receives a signal from the device under test with the input of the test signal, and measures whether or not a forward error correction (FEC) operation of the device under test is possible based on a comparison result of the received signal and the test signal. The error rate measuring apparatus includes:

an operation unit 4 that sets a codeword length of the FEC, an FEC symbol length, and an FEC symbol error threshold in accordance with a communication standard of the device under test;

error counting means 7b for counting an FEC symbol error detected at one FEC symbol interval between most significant bit string data and least significant bit string data of symbol string data obtained by receiving and converting the signal from the device under test based on a comparison result of error data and each of the most significant bit string data and the least significant bit string data of the symbol string data, and for counting the FEC symbol error as an uncorrectable codeword that is not capable of being forward error corrected when the number of the FEC symbol error in one codeword exceeds the FEC symbol error threshold;

a display unit 6 that identifies and displays the symbol string data according to presence or absence of the FEC symbol error in FEC symbol length units based on a counting result of the error counting means; and display control means 7d for performing display control by setting one zone of a display area of identification display of the display unit as one FEC symbol length, matching a length of a horizontal axis of the display area with one codeword length, and performing line feed in codeword length units so that a head of one codeword of the identification display is located at a left end of the display area and a tail of one codeword of the identification display is located at a right end of the display area.

According to a third aspect of the present invention, in the error rate measuring apparatus of the first or second aspect, the display unit 6 has a display area 33 having a plurality of rows, which is numbered corresponding to each row of the identification display and is linked to scroll display of the identification display, and the display control means 7d sets the codeword on a row in which the number of the FEC symbol errors in one codeword exceeds the FEC symbol error threshold as the uncorrectable codeword, and controls the display unit 6 to identify and display the display area on the row corresponding to the uncorrectable codeword.

According to a fourth aspect of the present invention, in the error rate measuring apparatus of the third aspect, the display control means 7d controls the display unit 6 to display a totalization result by a total number of the codewords and the number of the uncorrectable codewords.

According to a fifth aspect of the present invention, there is provided a codeword error display method for an error rate measuring apparatus 1 that inputs a non return to zero (NRZ) signal of a known pattern as a test signal to a device under test W, receives a signal from the device under test with the input of the test signal, and measures whether or not a forward error correction (FEC) operation of the device under test is possible based on a comparison result of the received signal and the test signal. The codeword error display method includes:

a step of setting, by an operation unit 4, a codeword length of the FEC, an FEC symbol length, and an FEC symbol error threshold in accordance with a communication standard of the device under test;

a step of counting, by error counting means 7b, an FEC symbol error detected at one FEC symbol interval based on a comparison result of error data and each bit of bit string data obtained by receiving and converting the signal from the device under test;

a step of counting, by the error counting means, the FEC symbol error as an uncorrectable codeword that is not capable of being forward error corrected when the number of the FEC symbol errors in one codeword exceeds the FEC symbol error threshold;

a step of identifying and displaying, on a display unit 6, the symbol string data according to presence or absence of the FEC symbol error in FEC symbol length units based on a counting result of the error counting means; and a step of performing, by display control means 7d, display control by setting one zone of a display area of identification display of the display unit as one FEC symbol length, matching a length of a horizontal axis of the display area with one codeword length, and performing line feed in codeword length units so that a head of one codeword of the identification display is located at a left end of the display area and a tail of one codeword of the identification display is located at a right end of the display area.

According to a sixth aspect of the present invention, there is provided a codeword error display method for an error rate measuring apparatus 1 that inputs a pulse amplitude modulation 4 (PAM4) signal of a known pattern as a test signal to a device under test W, receives a signal from the device under test with the input of the test signal, and measures whether or not a forward error correction (FEC) operation of the device under test is possible based on a comparison result of the received signal and the test signal. The codeword error display method includes:

a step of setting, by an operation unit 4, a codeword length of the FEC, an FEC symbol length, and an FEC symbol error threshold in accordance with a communication standard of the device under test;

a step of counting, by error counting means 7b, an FEC symbol error detected at one FEC symbol interval between most significant bit string data and least significant bit string data of symbol string data obtained by receiving and converting the signal from the device under test based on a comparison result of error data and each of the most significant bit string data and the least significant bit string data of the symbol string data;

a step of counting, by the error counting means, the FEC symbol error as an uncorrectable codeword that is not capable of being forward error corrected when the number of the FEC symbol errors in one codeword exceeds the FEC symbol error threshold;

a step of identifying and displaying, on a display unit 6, the symbol string data obtained by receiving and converting the signal from the device under test according to presence or absence of the FEC symbol error in FEC symbol length units; and a step of performing, by display control means 7d, display control by setting one zone of a display area of identification display of the display unit as one FEC symbol length, matching a length of a horizontal axis of the display area with one codeword length, and performing line feed in codeword length units so that a head of one codeword of the identification display is located at a left end of the display area and a tail of one codeword of the identification display is located at a right end of the display area.

According to a seventh aspect of the present invention, the codeword error display method according to the fifth or sixth aspect further includes:

a step of displaying, on the display unit 6, a display area 33 having a plurality of rows, which is numbered corresponding to each row of the identification display and is linked to the scroll display of the identification display; and a step of, by the display control means 7d, setting the codeword on a row in which the number of the FEC symbol errors in one codeword exceeds the FEC symbol error threshold as the uncorrectable codeword, and controlling the display unit 6 to identify and display the display area on the row corresponding to the uncorrectable codeword.

According to an eighth aspect of the present invention, the codeword error display method according to the seventh aspect further includes:

a step of controlling the display unit 6 to display a totalization result by a total number of the codewords and the number of the uncorrectable codewords by the display control means 7d.

Advantage of the Invention

According to the present invention, one codeword is displayed in one row, and a codeword delimiter is easy for the user to understand, such that an error occurrence status in FEC symbol length units for each codeword can be easily checked. Further, when the number of FEC symbol errors in data divided for each codeword exceeds the FEC symbol error threshold, it is possible to easily recognize where the row of the uncorrectable codeword is. Furthermore, it is possible to recognize an occurrence ratio of the uncorrectable codeword to the entire codewords. As a result, the user can easily investigate a cause of the defect of the device under test to perform efficient debugging.

BEST MODE FOR CARRYING OUT THE INVENTION

Hereinafter, a mode for carrying out the present invention will be described in detail referring to the accompanying drawings.

An error rate measuring apparatus according to the present invention transmits a test signal of a known pattern to a device under test in a state in which the device under test has transited to a state of signal pattern return and measures an error rate of a received signal returned from the device under test in compliance with the transmission of the test signal.

Figure 1:
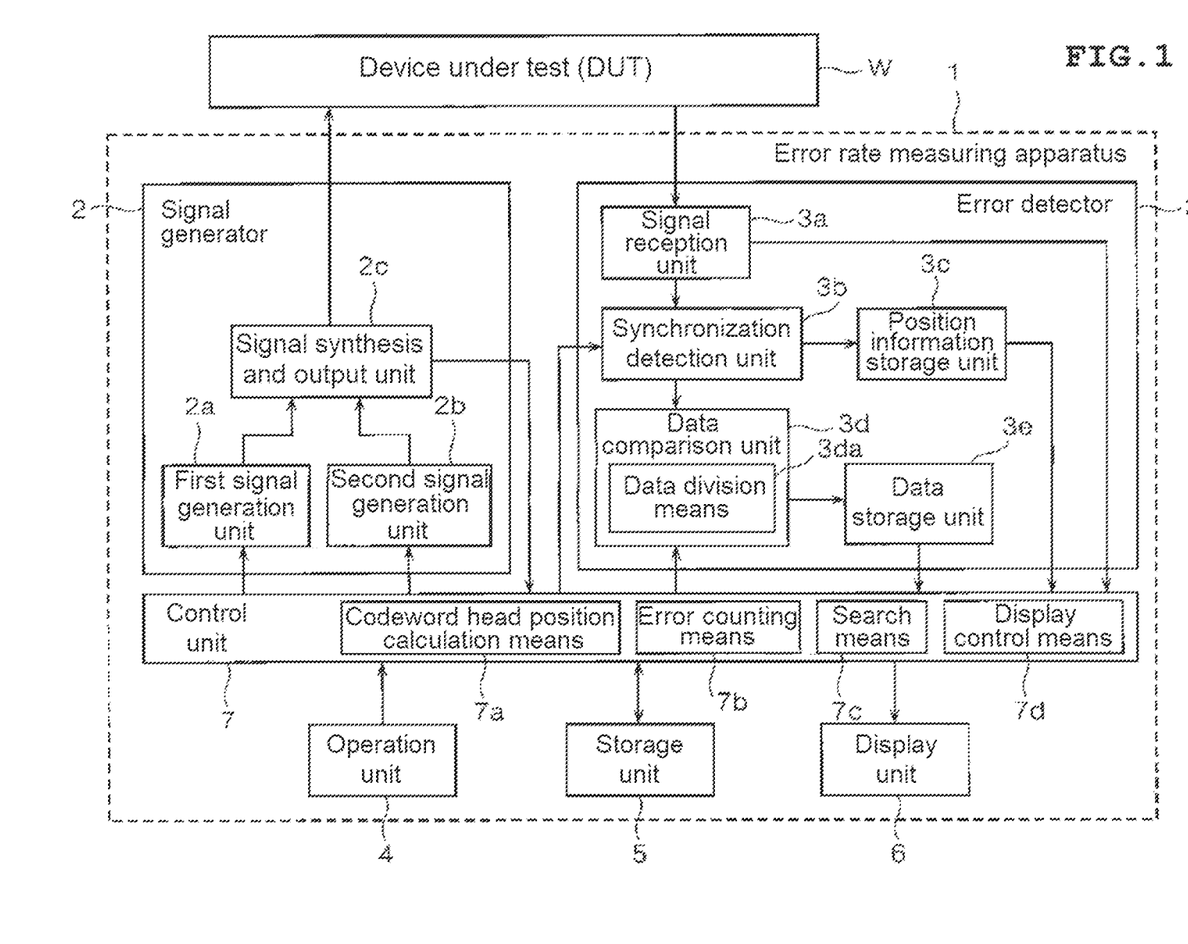
FIG. 1 is a block diagram showing a schematic configuration of an error rate measuring apparatus according to the present invention.

As shown in FIG. 1, an error rate measuring apparatus 1 of the present embodiment has a function of measuring whether or not a forward error correction (FEC) operation of a device under test W is possible based on a comparison result of a received signal from the device under test W when a non return to zero (NRZ) signal of a known pattern with an inserted error or a pulse amplitude modulation 4 (PAM4) signal having four symbol values is input as a test signal to the device under test W, and the test signal. The error rate measuring apparatus 1 schematically includes a signal generator 2, an error detector 3, an operation unit 4, a storage unit 5, a display unit 6, and a control unit 7.

In the present embodiment, the configuration and processing content for realizing the function of measuring whether or not the FEC operation of the device under test W is possible is primarily described.

The signal generator 2 generates, as reference data based on a multi-value signal, an NRZ signal in a system in which there is no return to zero between bits or a PAM4 signal formed of desired symbol string data (data of a string of symbols having symbol values of 0, 1, 2, and 3).

In a case of generating the PAM4 signal, as shown in FIG. 1, the signal generator 2 schematically includes a first signal generation unit 2a, a second signal generation unit 2b, and a signal synthesis and output unit 2c.

The PAM4 signal has amplitude that is divided into four kinds for each symbol, and has four different voltage levels of amplitude. An entire amplitude voltage range H is divided into a low voltage range, a medium voltage range, and a high voltage range in an ascending order of the voltage levels, and is formed of consecutive ranges based on three eye pattern openings.

Upon generating a desired PAM4 symbol string in a known pattern including fixed data, the first signal generation unit 2a generates most significant bit (MSB) string signal that is added to least significant bit (LSB) string signal to be generated by the second signal generation unit 2b to generate the PAM4 signal.

The second signal generation unit 2b generates the least significant bit string signal that is added to the most significant bit string signal generated by the first signal generation unit 2a to generate the PAM4 signal.

Examples of specific bit string signals that are generated by the first signal generation unit 2a and the second signal generation unit 2b include periodic patterns, such as various pseudo random patterns (Pseudo Random Bit Sequence (PRBS)) including PRBS7 (pattern length: $2^7$-1), PRBS9 (pattern length: $2^9$-1), PRBS10 (pattern length: $2^{10}$-1), PRBS11 (pattern length: $2^{11}$-1), PRBS15 (pattern length: $2^{15}$-1), and PRBS20 (pattern length: $2^{20}$-1), evaluation patterns for evaluating PAM including PRBS13Q, PRBS31Q, and SSPRQ, and a Reed-Solomon Forward Error Correction (RS-FEC) encoded scrambled idle pattern.

The signal synthesis and output unit 2c adds the most significant bit string signal generated by the first signal generation unit 2a and the least significant bit string signal generated by the second signal generation unit 2b to output the PAM4 signal. The PAM4 signal is input as a test signal of a known pattern to the device under test W in measuring an error rate or the like of the device under test W.

An error that is inserted into the test signal is optional. For example, any FEC symbol error is inserted in a case of checking FEC error tolerance of the device under test W. Furthermore, in a case of confirming tolerance of the device under test W, an error is inserted, and in a case where the device under test W confirms an error with any other test signals, an error is not inserted and confirmation is performed with a capture function.

The error detector 3 receives a signal to be output from the device under test W in compliance with the input of the NRZ signal or the PAM4 signal and measures the error rate or the like when the NRZ signal or the PAM4 signal to be reference data is input as the test signal of the known pattern from the signal generator 2 to the device under test W, and as shown in FIG. 1, includes a signal reception unit 3a, a synchronization detection unit 3b, a position information storage unit 3c, a data comparison unit 3d, and a data storage unit 3e.

In a case where the test signal input to the device under test W is the NRZ signal, the signal reception unit 3a samples the NRZ signal received from the device under test W in a predetermined sampling period to convert the signal into bit string data (data of a bit string having 0 and 1). The bit string data converted by the signal reception unit 3a is input to the synchronization detection unit 3b.

In a case where the test signal input to the device under test W is the PAM4 signal, the signal reception unit 3a samples the PAM4 signal received from the device under test W in a predetermined sampling period to convert the signal into symbol string data (data of a string of symbols having symbol values of 0, 1, 2, and 3). The symbol string data converted by the signal reception unit 3a is input to the synchronization detection unit 3b.

In a case where the test signal input to the device under test W is the NRZ signal, the synchronization detection unit 3b synchronously fetches the reference data that is data of the bit string of the NRZ signal to be a reference read from the storage unit 5 and the bit string data of the NRZ signal received from the device under test W and output from the signal reception unit 3a at a setting timing set in advance by the operation unit 4, and outputs the fetched bit string data to be input data to the data comparison unit 3d.

In a case where the test signal input to the device under test W is the PAM4 signal, the synchronization detection unit 3b synchronously fetches reference data that is data of the symbol string of the PAM4 signal to be a reference read from the storage unit 5 and the symbol string data of the PAM4 signal received from the device under test W and output from the signal reception unit 3a at a setting timing set in advance by the operation unit 4, and outputs the fetched symbol string data to be input data to the data comparison unit 3d.

The setting timing is set in advance by the operation unit 4, for example, on the setting screen (not shown) of the display unit 6, and is a timing at which a trigger signal is generated in response to a user's instruction, a timing at which a designated number of FEC symbol errors occur in one codeword length (for example, in a case where one codeword is 544 FEC symbols, and the user wants to capture at a timing at which 16 FEC symbol errors occur, synchronization is achieved at a timing at which 16/544 FEC symbol errors occur), or a timing at which a designated number of FEC symbol errors continuously occur (synchronization is achieved at a timing at which continuous FEC symbol errors occur by a number designated by the user, regardless of a codeword).

The synchronization detection unit 3b detects alignment marker information from the bit string data or the symbol string data received by the signal reception unit 3a, acquires codeword head symbol information from the detected alignment marker information, and notifies the position information storage unit 3c of the acquired codeword head symbol information.

The alignment marker information is obtained by detecting an alignment marker pattern included in a scrambled idle pattern appearing in a predetermined period as a pattern for lane identification by a known procedure meeting a communication standard.

The codeword head symbol information is a value indicating how many FEC symbol before the first symbol of the code word exists from the FEC symbol position data.

The FEC symbol position, that is, the head of one FEC symbol of the bit string data or the symbol string data is detected by making a counter of the data comparison unit 3d run free to assume the head.

The codeword head symbol information may be stored in advance in the storage unit 5 as FPGA information based on a fixed value by the error rate measuring apparatus 1 and may be read by the control unit 7 as necessary.

When synchronization is achieved, the synchronization detection unit 3b notifies the data comparison unit 3d that synchronization is achieved, and stores a synchronous position representing a position of a bit or a symbol in the reference data when synchronization is achieved, in the position information storage unit 3c.

When synchronization of the reference data and the bit string data of the NRZ signal or the symbol string data of the PAM4 signal from the signal reception unit 3a is achieved by the synchronization detection unit 3b, the position information storage unit 3c stores the synchronous position of the bit or the symbol in the reference data when synchronization is achieved. The position information storage unit 3c stores the codeword head symbol information notified from the synchronization detection unit 3b.

In a case where the test signal input to the device under test W is the NRZ signal, the data comparison unit 3d captures the head of one FEC symbol (10 bits or 20 bits) of the bit string data fetched synchronously with the reference data (test signal) at the setting timing by the synchronization detection unit 3b, and compares each bit with error data ("1") to detect errors of each one codeword length based on a codeword head position calculated by codeword head position calculation means 7a to be described later. That is, in a case where the bit of the bit string data is "1", it is detected as an error. The head of one FEC symbol of the bit string data is detected by making the counter of the data comparison unit 3d run free to assume the head.

In a case where the test signal input to the device under test W is the NRZ signal, the data comparison unit 3d divides the bit string data fetched synchronously with the reference data (test signal) at the setting timing by the synchronization detection unit 3b by one FEC symbol length (10 bits or 20 bits) and detects FEC symbol errors at one FEC symbol interval. For example, in a case where one FEC symbol length is 10 bits, the bit string data is divided by 10 bits, and in a case where an error occurs even in one bit within 10 bits, the error is detected as one FEC symbol error.

In a case where the test signal input to the device under test W is the PAM4 signal, the data comparison unit 3d captures the head of one FEC symbol (10 bits or 20 bits) of the symbol string data fetched synchronously with the reference data (test signal) at the setting timing by the synchronization detection unit 3b to divide the symbol string data into most significant bit string data (hereinafter, referred to as MSB data) and least significant bit string data (hereinafter, referred to as LSB data) by data division means 3da, and compares each of the MSB data and the LSB data with the error data ("1") to detect each of most significant bit error (hereinafter, referred to as an MSB error) and least significant bit error (hereinafter, referred to as an LSB error) of each one codeword length based on the codeword head position calculated by the codeword head position calculation means 7a to be described later. That is, in a case where the divided MSB data is "1", it is detected and counted as an MSB error, and in a case where the divided LSB data is "1", it is detected as an LSB error. The head of one FEC symbol of the symbol string data is detected by making the counter of the data comparison unit 3d run free to assume the head.

In a case where the test signal input to the device under test W is the PAM4 signal, the data comparison unit 3d divides MSB data and LSB data by each one FEC symbol length (10 bits or 20 bits), and detects FEC symbol errors in each of the MSB data and the LSB data at one FEC symbol interval. For example, in a case where one FEC symbol length is 10 bits, the MSB data and the LSB data are divided by 10 bits, and in a case where an error occurs even in one bit within 10 bits, the error is detected as one FEC symbol error.

In FIG. 1, for convenience of description, although a configuration in which the data comparison unit 3d includes the data division means 3da has been described, the data division means 3da can be configured of a known PAM decoder, for example.

The data storage unit 3e stores comparison result data by the data comparison unit 3d, FEC symbol position data indicating the head of one FEC symbol of the bit string data or the symbol string data, or the like along with the bit string data or the symbol string data synchronized with the reference data.

The operation unit 4 also functions as setting means, and is configured of, for example, a user interface, such as an operation knob, various keys, switches, or buttons of the error rate measuring apparatus 1 of FIG. 1, or softkeys on a display screen of the display unit 6. The operation unit 4 executes various kinds of setting associated with error rate measurement, such as setting of the codeword length of the FEC, FEC symbol length, and setting timing based on the communication standard, setting of the FEC symbol error threshold, designation of blocks of the captured data (bit string data or symbol string data) displayed on the display screen of the display unit 6, setting of baud rate or occurrence conditions of a bit string or a symbol string, and an instruction to start or end the error rate measurement.

The FEC symbol error threshold can be arbitrarily set as a positive integer value including 0 by the operation of the operation unit 4. However, in performing FEC evaluation based on a communication standard, such as IEEE802.3ck, when the FEC symbol error threshold is set to "8" in a case where the test signal input to the device under test W is the NRZ signal, and the FEC symbol error threshold is set to "16" in a case where the test signal input to the device under test W is the PAM4 signal, it is possible to perform evaluation about whether or not the test signal input to the device under test W conforms to the communication standard.

The storage unit 5 stores symbol string data fetched from the signal reception unit 3a in units of blocks at the setting timing set in advance with a storage capacity allocated in advance under the control of the control unit 7. In the present embodiment, a mass of symbol string data that can be displayed in one display area (a display size including scroll display) of the display unit 6 is defined as one block. For example, in a case where the storage capacity to be allocated is 8 Mbits (corresponding to 4 Msymbols of symbol string data) and a mass of symbol string data that can be displayed in one display area of the display unit 6 is defined as one block, 1 block=65536 bits=32768 symbols, the symbol string data of 4 Msymbols is divided into a predetermined number of divisions (any number of divisions of 1, 2, 4, 8, 16, 32, 64, and 128) set in advance and stored in the storage unit 5.

A maximum number of divisions of the symbol string data is determined according to the storage capacity allocated to the storage unit 5. For example, in a case where the storage capacity allocated to the storage unit 5 is 8 Mbits, the maximum number of divisions of the symbol string data is 128.

The storage unit 5 stores a bit string of the NRZ signal or a symbol string of the PAM4 signal (a string of symbols having symbol values of 0, 1, 2, and 3) input to the device under test W as a test signal of a known pattern from the signal synthesis and output unit 2c. The bit string of the NRZ signal or the symbol string of the PAM4 signal input to the device under test W as the test signal of the known pattern is reference data to be a reference for comparison with input data that is generated from the signal received from the device under test W.

The storage unit 5 stores a counting result of error counting means 7b described below of the control unit 7. In addition, the storage unit 5 stores information regarding the setting timing, the baud rate, the generation conditions of the bit string or the symbol string, and the like. Such information can be appropriately selected and set by the operation unit 4 through the user interface.

A configuration may be made in which, in a case where the control unit 7 or the signal generator 2 can recognize the bit string of the NRZ signal or the symbol string of the PAM4 signal to be the test signal, the bit string of the NRZ signal or the symbol string of the PAM4 signal that is the test signal of the known pattern, that is, the reference data is stored from the control unit 7 or the signal generator 2 to the storage unit 5.

The display unit 6 is configured of, for example, a liquid crystal display or the like in the error rate measuring apparatus 1 of FIG. 1, and displays the setting screen regarding an error rate measurement, each compliance test (a test about whether or not the device under test W conforms to the communication standard) including the error rate measurement, the capture screen, and the like under the control of display control means 7d described below. The display unit 6 also has an operation function of the operation unit 4, such as softkeys on the display screen.

Figure 2:
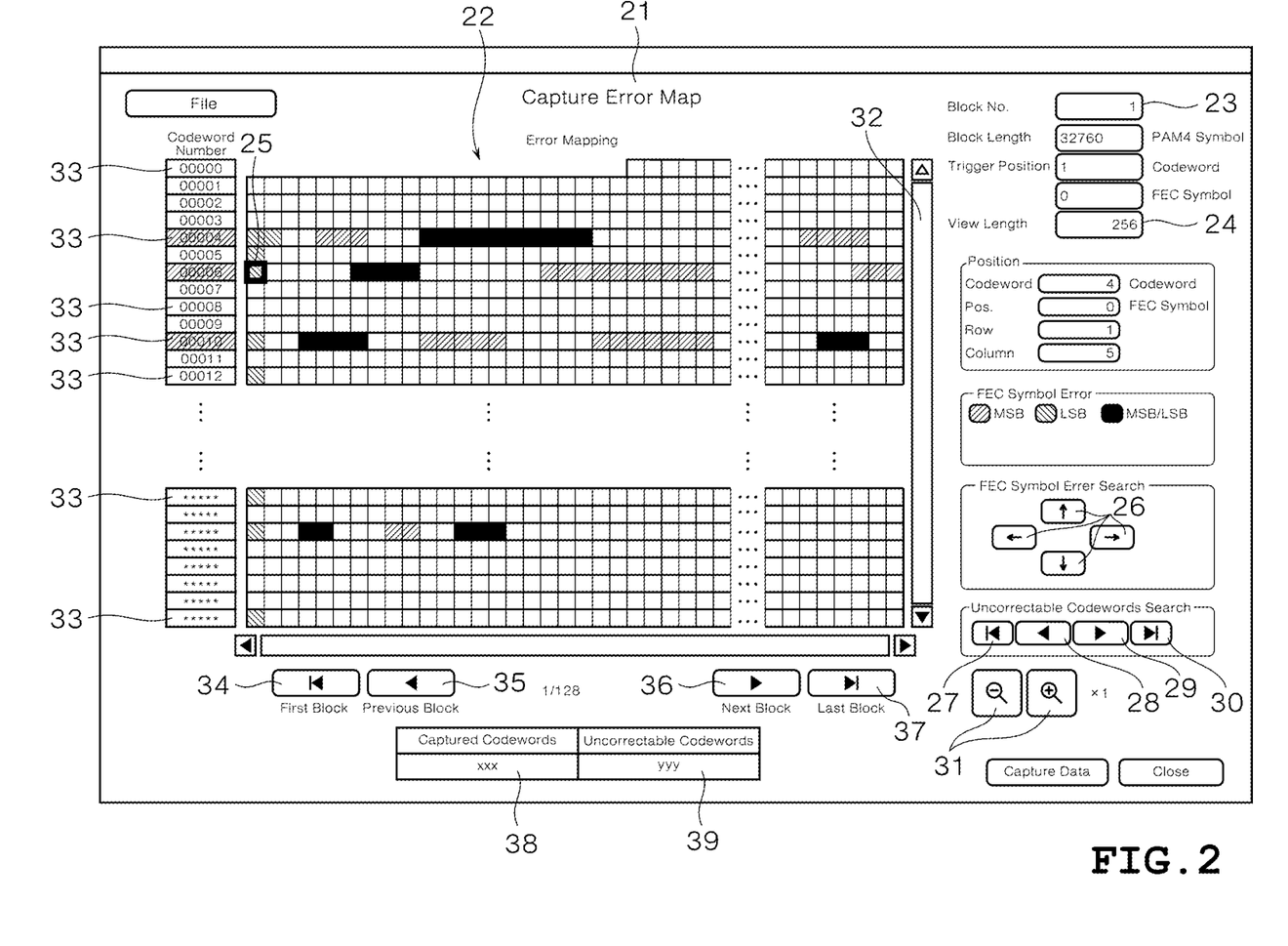
FIG. 2 is a diagram showing an example of a capture error map screen when a pulse amplitude modulation 4 (PAM4) signal is input to a device under test in the error rate measuring apparatus according to the present invention.
Figure 3:
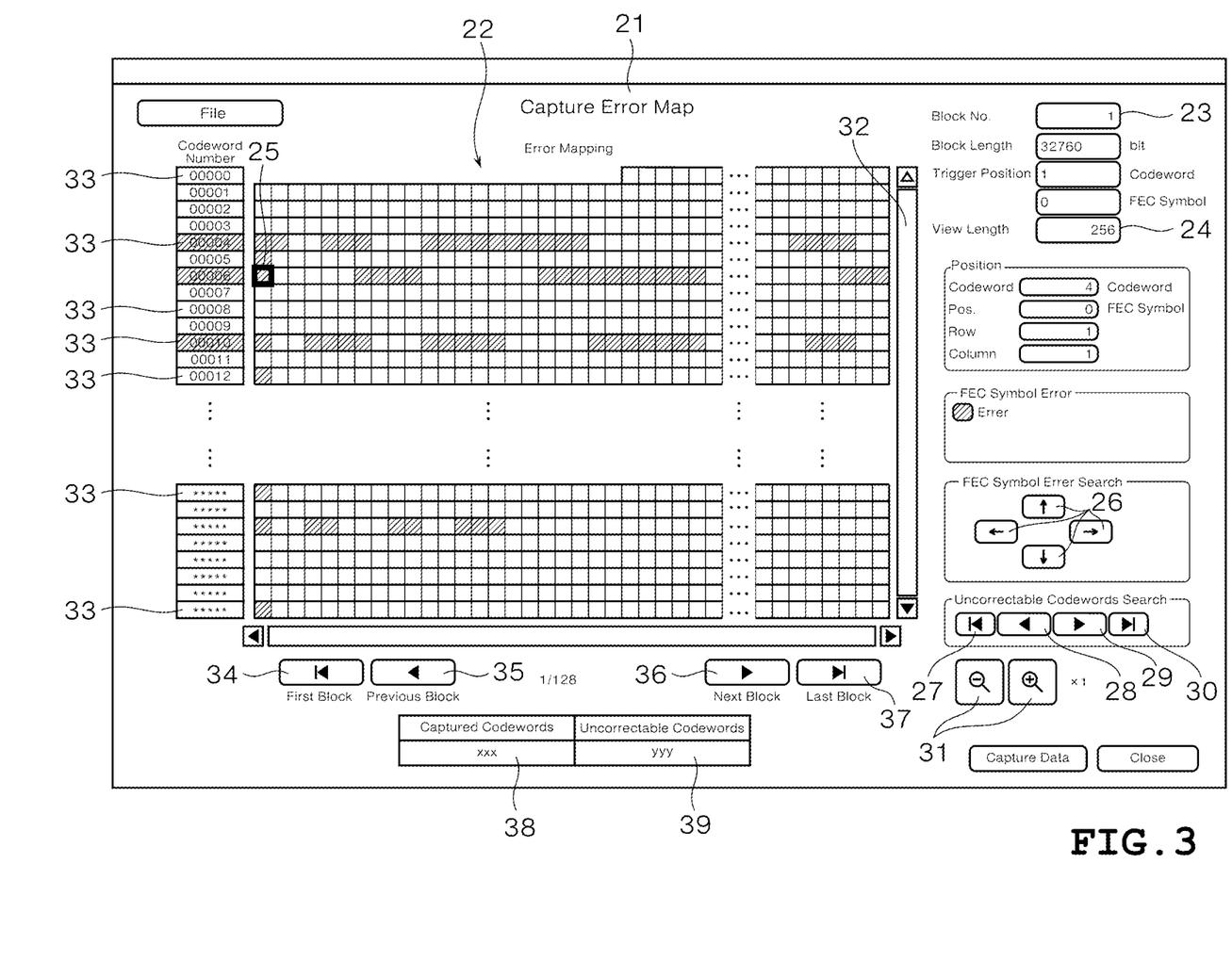
FIG. 3 is a diagram showing an example of a capture error map screen when a non return to zero (NRZ) signal is input to the device under test in the error rate measuring apparatus according to the present invention.

The display unit 6 displays a capture error map screen (hereinafter, abbreviated as a map screen) 21 in a display form shown in FIG. 2 or 3, for example, under the control of the display control means 7d to be described later. FIG. 2 shows the map screen 21 when the PAM4 signal is input to the device under test W, and FIG. 3 shows the map screen 21 when the NRZ signal is input to the device under test W.

Here, although the map screen 21 will be described referring to FIG. 2 as an example, on the map screens 21 of FIG. 3, the same components as those in FIG. 2 are represented by the same numbers, and description thereof will not be repeated.

FIG. 2 shows an example of the map screen 21 of the display unit 6 when the PAM4 signal is input to the device under test W. An error mapping area 22 for identifying and displaying the symbol string data in FEC symbol length units according to the presence or absence of the FEC symbol error is formed on the map screen 21 of FIG. 2. In an upper right area on the error mapping area 22, "Block No.", "Block Length", "Trigger Position", and "View Length" are displayed. In "Block No.", an input box 23 for inputting a numerical value indicating what number of block of data is displayed on the error mapping area 22 is displayed. In "Block Length", a size (length) of data for one block is displayed. In "Trigger Position", a position of a trigger is displayed. The example of FIG. 2 shows a state in which "1" is input to the input box 23 of "Block No.", "Block Length" is displayed as "32760" PAM4 Symbol, and "Trigger Position" is displayed as "1" Codeword and "0" FEC symbol. In "View Length", an input box 24 for inputting a numerical value of a zone length of one row for displaying data is displayed. The example of FIG. 2 shows that "256" is input to the input box 24 of "View Length", and the zone length of one row for displaying data is "256". In the input box 23 of "Block No.", the numerical value up to the number of divisions (for example, 1 to 128) of the block determined according to the storage capacity of the storage unit 5 can be set and input.

In the area under "View Length" on the map screen 21, "Position" indicating a position of a cursor 25 in the error mapping area 22 is displayed. In "Position", "Codeword" and "Pos." indicate which codeword and which FEC symbol is selected by the cursor 25, and "Row" and "Column" indicate coordinate positions of the cursor 25 of a horizontal axis (row) and a vertical axis (column) on the error mapping area 22, respectively.

In an area under "Position" on the map screen 21, "FEC Symbol Error" is displayed. "FEC Symbol Error" identifies and displays the presence or absence of an FEC symbol error by color-coding. In the example of FIG. 2, when only the MSB has the FEC symbol error, "FEC Symbol Error" is displayed in red (a right diagonal line part in FIG. 2) for example, when only the LSB has the FEC symbol error, "FEC Symbol Error" is displayed in yellow (a left diagonal line part in FIG. 2) for example, and when both the MSB and the LSB have the FEC symbol error, "FEC Symbol Error" is displayed in orange (a black part in FIG. 2) for example.

When the NRZ signal is input to the device under test W, "FEC Symbol Error" on the map screen 21 is displayed in red (a right diagonal line part in FIG. 3) for example only when there is the FEC symbol error, as shown in FIG. 3.

In an area under "FEC Symbol Error" on the map screen 21, as "FEC Symbol Error Search", the FEC symbol error is searched starting from a position of the cursor 25, and upper, lower, left, and right arrow keys 26 for moving the cursor 25 to the searched position is displayed.

In an area under "FEC Symbol Error Search" on the map screen 21, "Uncorrectable Codewords Search" for searching for a head error of the desired codeword as the uncorrectable codeword by the search means 7c of the control unit 7, which will be described later, and moving the cursor 25 is displayed. In "Uncorrectable Codewords Search", a soft key 27 for moving the cursor 25 to a position of the head error at a head of the uncorrectable codeword in the block, a soft key 28 for moving the cursor 25 to a position of the head error at one previous of the uncorrectable codeword in the block starting from the position of the cursor 25, a softkey 29 for moving the cursor 25 to a position of the head error at one ahead of the uncorrectable codeword in the block starting from the position of the cursor 25, and a softkey 30 for moving the cursor 25 to a position of the head error at a tail of the uncorrectable codeword in the block are displayed.

A magnifier button 31 for enlarging and reducing the screen is displayed in the area under "Uncorrectable Codewords Search" on the map screen 21.

In the error mapping area 22 on the map screen 21, the presence or absence of the FEC symbol error in the symbol string data is identified and displayed in FEC symbol length units. More specifically, in a display area of identification display of the error mapping area 22, one zone is set as one FEC symbol length, and the zone length of the horizontal axis matches the codeword length. For example, if codeword length=544 and FEC symbol length=10 bits, one zone=1 FEC symbol, and "View Length"=544 is thus set. That is, "View Length" is fixed at one codeword length.

Therefore, in a mode in which the PAM4 signal is input to the device under test W, if the FEC symbol length is 10 bits, one zone is represented by 20 bits including MSB/LSB FEC symbols, and if the FEC symbol length is 20 bits, one zone is represented by 40 bits including MSB/LSB FEC symbols.

In a mode in which the NRZ signal is input to the device under test W, if the FEC symbol length is 10 bits, one zone is represented by 10 bits of the FEC symbol, and if the FEC symbol length is 20 bits, one zone is represented by 20 bits of the FEC symbol.

The captured symbol string data performs line feed in codeword length units and one codeword is displayed in one row, so that a head of the codeword is located at a left end of the error mapping area 22 and a tail of the codeword is located at a right end of the error mapping area 22 in a state in which the presence or absence of the FEC symbol error is identified and displayed in FEC symbol length units. For example, focusing on the codeword on the fifth row in FIG. 2, it is indicated that only the LSB of the symbol string data of the first and second FEC symbols from the left end indicated by the left diagonal line has the FEC symbol error, it is indicated that only the MSB of the symbol string data of the fifth to seventh FEC symbols and 251st to 254th FEC symbols from the left end indicated by the right diagonal line has the FEC symbol error, and it is indicated that both the MSB and the LSB of the symbol string data of the eleventh to twentieth FEC symbols from the left end indicated by black have the FEC symbol error.

The data divided for each codeword that cannot be displayed on the error mapping area 22 can be displayed and checked on the error mapping area 22 by scrolling using a scroll bar 32 on the right side.

"Codeword Number" is displayed on the left side of the error mapping area 22. "Codeword Number" is composed of a plurality of rows of display areas 33 arranged side by side in a column direction (row direction) corresponding to the codewords of respective rows of the error mapping area 22. In "Codeword Number", the display area 33 of the row corresponding to the row of the codeword counted as the uncorrectable codeword by the error counting means 7b to be described later is identified and displayed. In the example of FIG. 2, since the codewords on the fifth and eleventh rows of the error mapping area 22 are counted as uncorrectable codewords, the fifth and eleventh rows of the display areas 33 in "Codeword Number" corresponding to those on the fifth and eleventh rows of the error mapping area 22 are identified and displayed in red (a right diagonal line in FIG. 2) for example. As a result, it is possible to easily recognize a row of the codeword counted as an uncorrectable codeword.

The display area 33 of the "Codeword Number" is scrolled and displayed in conjunction with the scrolling of the data divided for each codeword displayed on the error mapping area 22 by using the scroll bar 32. In addition, in the display area 33 of the "Codeword Number", a row that does not become the uncorrectable codeword is identified and displayed in a predetermined color such as light blue, and a row in which the codeword is less than one codeword is identified and displayed in a predetermined color such as gray. In this case, if the display area 33 corresponding to the codeword of the row counted as the uncorrectable codeword is highlighted with a conspicuous color such as red, the position of the codeword counted as the uncorrectable codeword can be checked at a glance.

Further, the display area 33 of the "Codeword Number" can be numbered and displayed in order from the top corresponding to the codeword of each row in the error mapping area 22. For example, as shown in FIG. 2, the display area 33 of the "Codeword Number" is numbered and displayed in order from the top so that the display area 33 corresponding to the codeword on a first row in the error mapping area 22 is "00000", the display area 33 corresponding to the codeword on a second row in the error mapping area 22 is "00001", and the display area 33 corresponding to the codeword on a third row in the error mapping area 22 is "00002". As a result, it is possible to easily numerically check how many codewords are by looking at the number assigned to the display area 33, when the display area 33, which corresponds to the codeword on the row counted as the uncorrectable codeword, is identified and displayed.

The codewords in respective rows of the error mapping area 22 may be numbered in order from the top, and all the numbers corresponding to the codeword rows counted as uncorrectable codewords may be displayed in a list on a margin area of the map screen 21 or a separate area.

When the error mapping area 22 is displayed in a smaller size than 1 time with the magnifier button 31 and the number of the display area 33 is difficult to read, it is preferable not to display the number of the display area 33. In this case, if the cursor 25 is moved to the codeword of the row counted as the uncorrectable codeword, it is possible to determine from "Codeword" and "Pos." of the "Position" what codeword is the row counted as the uncorrectable codeword.

Below the error mapping area 22 on the map screen 21, a softkey 34 that gives an instruction to display data of a first block on the error mapping area 22, a softkey 35 that gives an instruction to display data of a previous block in the error mapping area 22, a softkey 36 that gives an instruction to display data of a next block in the error mapping area 22, and a softkey 37 that gives an instruction to display data of a last block on the error mapping area 22 are displayed.

In an area under the map screen 21, "Captured Codewords" and "Uncorrectable Codewords" are displayed as totalization results of the uncorrectable codewords. In "Captured Codewords", the total number "xxx" of the captured codewords is displayed in one display box 38 as a totalization result, and the number "yyy" of uncorrectable codewords is displayed in the other display box 39. As a result, it is possible to check at a glance the number of uncorrectable codewords with respect to the total number of the captured codewords.

The control unit 7 is configured of, for example, a central processing unit (CPU) and a storage element, such as a read only memory (ROM) or a random access memory (RAM), to measure an error rate of the PAM4 signal, integrally controls the signal generator 2, the error detector 3, the operation unit 4, the storage unit 5, and the display unit 6, and includes codeword head position calculation means 7a, error counting means 7b, search means 7c, and display control means 7d.

The codeword head position calculation means 7a calculates the codeword head position based on the setting information by the operation unit 4, the codeword head symbol information stored in the position information storage unit 3c, and the FEC symbol position stored in the data storage unit 3e.

More specifically, the codeword head position calculation means 7a calculates the codeword head position by a calculation expression of FEC symbol position−(codeword head symbol information: FEC symbol length) . . . (1), based on the FEC symbol length (10 bits or 20 bits) set by the operation unit 4, the codeword head symbol information stored in the position information storage unit 3c by notification from the synchronization detection unit 3b, and the FEC symbol position stored in the data storage unit 3e by notification from the data comparison unit 3d.

In a case where the test signal input to the device under test W is the NRZ signal, the error counting means 7b counts errors detected by the data comparison unit 3d (including counting codewords). In addition, the error counting means 7b counts the FEC symbol error detected by the data comparison unit 3d at one FEC symbol interval. Further, the error counting means 7b counts the FEC symbol error as an uncorrectable codeword that cannot be forward error corrected when the number of the FEC symbol errors in one codeword exceeds the FEC symbol error threshold.

In a case where the test signal input to the device under test W is the PAM4 signal, the error counting means 7b counts the MSB error and the LSB error detected by the data comparison unit 3d (including counting codewords). In addition, the error counting means 7b counts the FEC symbol error detected by the data comparison unit 3d at one FEC symbol interval. Further, the error counting means 7b counts the FEC symbol error as an uncorrectable codeword that cannot be forward error corrected when the number of the FEC symbol errors in one codeword exceeds the FEC symbol error threshold.

On the map screen 21 of FIG. 2 or 3, the search means 7c searches the head error of the uncorrectable codeword based on any operation of the four softkeys 27, 28, 29, and 30 of "Uncorrectable Codewords Search" described above starting from the cursor 25 at any position in the error mapping area 22 (any position on any row of the codeword), and moves the cursor 25 to the searched position. For example, on the map screen 21 of FIG. 2, when the softkey 29 is pressed in a state in which the cursor 25 is located at the head error of the codeword on the fifth row counted as the uncorrectable codeword, the search means 7c searches the head error of the codeword on the eleventh row counted as the next uncorrectable codeword starting from the position of the cursor 25, and moves the cursor 25 to the searched position.

The display control means 7d performs display control on the display screen of the display unit 6 such as, in addition to the map screen 21 of FIG. 2 or 3 for example, a setting screen for performing various settings required for measuring an error rate, and a capture screen of the bit string data or symbol string data acquired from the device under test W in compliance with the input of the PAM4 signal or the NRZ signal to the device under test W, performs display control on a movement of the cursor 25 based on the operation of the operation unit 4 (softkeys 34, 35, 36, and 37), and the like.

Next, as a processing operation from counting of the FEC symbol error in FEC symbol units of the error rate measuring apparatus 1 configured as above to identifying and displaying the FEC symbol error on the map screen 21, a case in which the test signal of the PAM4 signal is input to the device under test W will be described as an example referring to FIG. 4.

Figure 4:
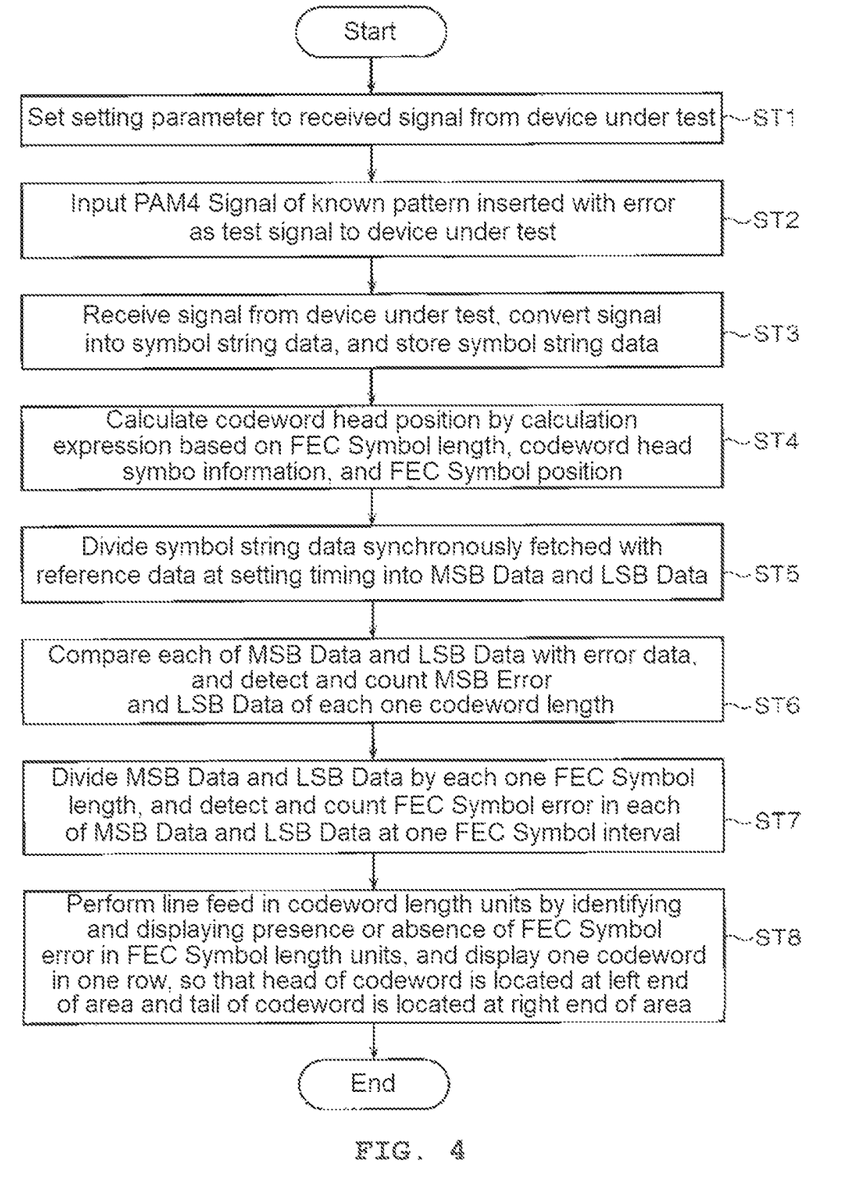
FIG. 4 is a flowchart of a processing operation in a case where the PAM4 signal is input to the device under test in the error rate measuring apparatus according to the present invention.

As shown in FIG. 4, first, the setting parameters to the received signal from the device under test W are set by the operation unit 4 (ST1). Specifically, on the setting screen of the display unit 6, one codeword length, one FEC symbol length, and the FEC symbol error threshold are set based on the communication standard of the device under test W to be measured or the preset setting (for example, 50G PAM4) in accordance with the communication standard of the device under test W is selected and set.

After the above-described setting ends, the PAM4 signal (for example, 50G PAM4 conforming to the setting parameters) of the known pattern with an inserted error is input as the test signal to the device under test W by the signal generator 2 (ST2).

Then, a signal returned from the device under test W in compliance with the input of the test signal to the device under test W is received and converted into symbol string data by the signal reception unit 3a, and the converted symbol string data is stored in the storage unit 5 (ST3).

Next, the codeword head position is calculated by the calculation expression (1) based on the FEC symbol length set by the operation unit 4, the codeword head symbol information stored in the position information storage unit 3c, and the FEC symbol position stored in the data storage unit 3e (ST4).

Next, the head of one FEC symbol (10 bits or 20 bits) of the symbol string data fetched from the storage unit 5 synchronously with the reference data (test signal) at the setting timing is captured, and the symbol string data is divided into MSB data and LSB data by the data division means 3da (ST5). The head of one FEC symbol of the symbol string data is detected by making the counter of the data comparison unit 3d run free to assume the head.

Subsequently, each of the MSB data and the LSB data is compared with the error data ("1") by the data comparison unit 3d to detect each of MSB errors and LSB errors of each one codeword length based on the codeword head position calculated by the codeword head position calculation means 7a, and the detected MSB errors and LSB errors of each one codeword length are counted by the error counting means 7b (ST6). In this case, the number of codewords is also counted.

The error data ("1") is divided into error data for comparing with the MSB data and error data for comparing with the LSB data, in a case where the MSB data is "1", this is detected and counted as an MSB error, and in a case where the LSB data is "1", this is detected and counted as an LSB error.

Then, the MSB data and the LSB data are divided by each one FEC symbol length, FEC symbol errors are detected in each of the MSB data and the LSB data at one FEC symbol interval, and the detected FEC symbol errors are counted by the error counting means 7b (ST7). For example, in a case where one FEC symbol length is 10 bits, the MSB data and the LSB data are divided by 10 bits, and in a case where an error occurs even in one bit within 10 bits, this is detected and counted as one FEC symbol error.

The captured symbol string data performs line feed in codeword length units by identifying and displaying the presence or absence of the FEC symbol error in FEC symbol length units, and one codeword is displayed in one row, so that as codeword error display under the control of the display control means 7d, the head of the codeword calculated by the codeword head position calculation means 7a is located at a left end of the error mapping area 22 and a tail of the codeword is located at a right end of the error mapping area 22 as illustrated in FIG. 2 (ST8).

Next, as a processing operation from counting of the FEC symbol error in FEC symbol units of the error rate measuring apparatus 1 configured as above to identifying and displaying the FEC symbol error on the map screen 21, a case in which the test signal of the NRZ signal is input to the device under test W will be described as an example referring to FIG. 5.

Figure 5:
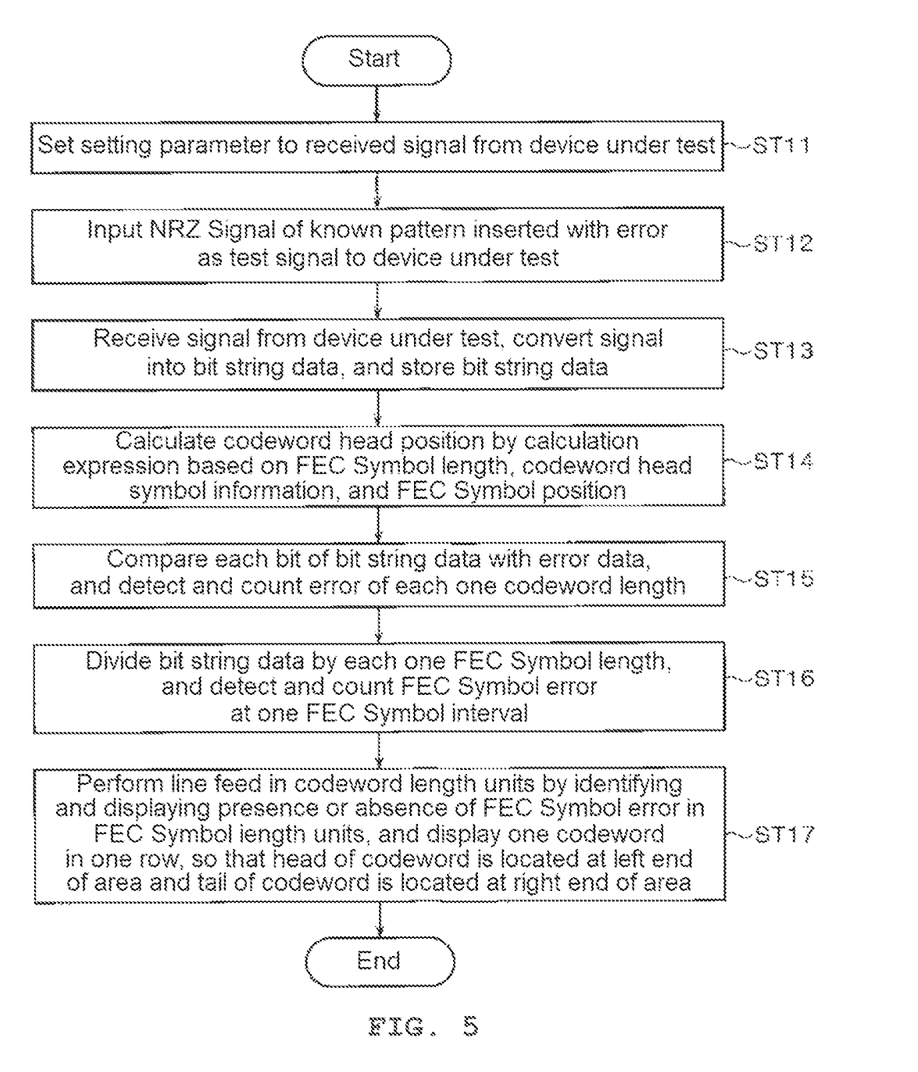
FIG. 5 is a flowchart of a processing operation in a case where the NRZ signal is input to the device under test in the error rate measuring apparatus according to the present invention.

As shown in FIG. 5, first, the setting parameters to the received signal from the device under test W are set by the operation unit 4 (ST11). Specifically, on the setting screen of the display unit 6, one codeword length, one FEC symbol length, and the FEC symbol error threshold are set based on the communication standard of the device under test W to be measured or the preset setting (for example, 25G NRZ) in accordance with the communication standard of the device under test W is selected and set.

After the above-described setting ends, the NRZ signal (for example, 25G NRZ or the like conforming to the setting parameters) of the known pattern with an inserted error is input as the test signal to the device under test W by the signal generator 2 (ST12).

Then, a signal returned from the device under test W in compliance with the input of the test signal to the device under test W is received and converted into bit string data by the signal reception unit 3a, and the converted bit string data is stored in the storage unit 5 (ST13).

Next, the codeword head position is calculated by the calculation expression (1) based on the FEC symbol length set by the operation unit 4, the codeword head symbol information stored in the position information storage unit 3c, and the FEC symbol position stored in the data storage unit 3e (ST14).

Next, the head of one FEC symbol (10 bits or 20 bits) of the bit string data fetched from the storage unit 5 synchronously with the reference data (test signal) at the setting timing is captured, each bit is compared with the error data ("1") by the data comparison unit 3d to detect errors of each one codeword length based on the codeword head position calculated by the codeword head position calculation means 7a, and the detected errors of each one codeword length are counted by the error counting means 7b (ST15). In this case, the number of codewords is also counted. The head of one FEC symbol of the bit string data is detected by making the counter of the data comparison unit 3d run free to assume the head.

Subsequently, the bit string data is divided by each one FEC symbol length, FEC symbol errors are detected at one FEC symbol interval, and the detected FEC symbol errors are counted by the error counting means 7b (ST16). For example, in a case where one FEC symbol length is 10 bits, the bit string data is divided by 10 bits, and in a case where an error occurs even in one bit within 10 bits, this is detected and counted as one FEC symbol error.

The captured bit string data performs line feed in codeword length units by identifying and displaying the presence or absence of the FEC symbol error in FEC symbol length units, and one codeword is displayed in one row, so that as codeword error display under the control of the display control means 7d, the head of the codeword calculated by the codeword head position calculation means 7a is located at a left end of the error mapping area 22 and a tail of the codeword is located at a right end of the error mapping area 22 as illustrated in FIG. 3 (ST17).

On the map screen 21 of FIGS. 2 and 3, when the cursor 25 moves to the codeword that has become the uncorrectable codeword, any of the four softkeys 27, 28, 29, and 30 arranged in the "Uncorrectable Codewords Search" on the map screen 21 is operated.

For example, as shown on the map screen 21 of FIGS. 2 and 3, when the softkey 29 is pressed in a state in which the cursor 25 is located at a position of the head error of the codeword on the seventh row that is the uncorrectable codeword on the block of the error mapping area 22, the cursor 25 moves to a position of the head error at one ahead of the uncorrectable codeword in the error mapping area 22, that is, a position of the head error on the eleventh row of the codeword which is the uncorrectable codeword.

When the softkey 27 is pressed in a state in which the cursor 25 is located at the position shown on the map screen 21 of FIGS. 2 and 3, the cursor 25 moves to a position of the head error at a head of the uncorrectable codeword (the codeword on the fifth row) in the block of the error mapping area 22. In addition, when the softkey 28 is pressed, the cursor 25 moves to a position of the head error at one previous of the uncorrectable codeword (the codeword on the fifth row) in the block of the error mapping area 22. Furthermore, when the softkey 30 is pressed, the cursor 25 moves to a position of the head error at a tail of the uncorrectable codeword in the block of the error mapping area 22.

Incidentally, in the above-described embodiment, as shown in FIG. 1, although the error rate measuring apparatus 1 includes the signal generator 2, the error detector 3, the operation unit 4, the storage unit 5, the display unit 6, and the control unit 7, the embodiment is not limited to this configuration. For example, the signal generator 2 and the error detector 3 can also be separately modularized or may be housed in individual housings, and can also be configured of an external apparatus, such as a personal computer to which the operation unit 4 and the display unit 6 are externally connected.

As described above, according to the present embodiment, the captured data (bit string data or symbol string data) is identified and displayed on the map screen 21 of error mapping according to the presence or absence of the FEC symbol error (occurrence or non-occurrence of the FEC symbol error) in FEC symbol length units. In this case, the captured data is displayed and controlled by performing line feed in codeword length units so that a head of one codeword of the identification display is located at the left end of the error mapping area 22, and a tail of one codeword of identification display is located at the right end of the error mapping area 22. As a result, one codeword is displayed in one row, and a codeword delimiter is easy for the user to understand, such that an error occurrence status in FEC symbol length units for each codeword can be easily checked.

A codeword on a row in which the number of the FEC symbol errors in one codeword exceeds the FEC symbol error threshold is set as an uncorrectable codeword that cannot be forward error corrected, and a row of the display area 33 corresponding to and linked to the uncorrectable codeword is identified and displayed. As a result, when the number of FEC symbol errors in data divided for each codeword exceeds the FEC symbol error threshold, it is possible to easily recognize where the row of the uncorrectable codeword is.

Furthermore, the total number of codewords and the number of uncorrectable codewords are displayed on the display unit 6. As a result, it is possible to recognize an occurrence ratio of the uncorrectable codeword to the entire codewords. Thus, the user can easily investigate a cause of the defect of the device under test to perform efficient debugging.

Although the best mode of the error rate measuring apparatus and the codeword error display method according to the present invention has been described above, the present invention is not limited by the description and the drawings according to this mode. That is, it is a matter of course that other modes, examples, operation techniques, and the like made by those skilled in the art based on this mode are all included in the scope of the present invention.

DESCRIPTION OF REFERENCE NUMERALS AND SIGNS 1 error rate measuring apparatus
2 signal generator
2a first signal generation unit
2b second signal generation unit
2c signal synthesis and output unit
3 error detector
3a signal reception unit
3b synchronization detection unit
3c position information storage unit
3d data comparison unit
3da data division means
3e data storage unit
4 operation unit
5 storage unit
6 display unit
7 control unit
7a codeword head position calculation means
7b error counting means
7c search means
7d display control means
21 map screen (capture error map screen)
22 error mapping area
23, 24 input box
25 cursor
26 arrow key
27, 28, 29, 30 softkey
31 magnifier button
32 scroll bar
33 display area
34, 35, 36, 37 softkey
38, 39 display box
W device under test

What is claimed is:

1. An error rate measuring apparatus that inputs a non return to zero (NRZ) signal of a known pattern as a test signal to a device under test (W), receives a signal from the device under test with the input of the test signal, and measures whether or not a forward error correction (FEC) operation of the device under test is possible based on a comparison result of the received signal and the test signal, the error rate measuring apparatus comprising:
an operation unit that sets a codeword length of the FEC, an FEC symbol length, and an FEC symbol error threshold in accordance with a communication standard of the device under test;
error counting means for counting an FEC symbol error detected at one FEC symbol interval based on a comparison result of error data and each bit of bit string data obtained by receiving and converting the signal from the device under test, and for counting the FEC symbol error as an uncorrectable codeword that is not capable of being forward error corrected when the number of the FEC symbol errors in one codeword exceeds the FEC symbol error threshold;
a display unit that identifies and displays the bit string data according to presence or absence of the FEC symbol error in FEC symbol length units based on a counting result of the error counting means; and
display control means for performing display control by setting one zone of a display area of identification display of the display unit as one FEC symbol length, matching a length of a horizontal axis of the display area with one codeword length, and performing line feed in codeword length units so that a head of one codeword of the identification display is located at a left end of the display area and a tail of one codeword of the identification display is located at a right end of the display area.

2. An error rate measuring apparatus that inputs a pulse amplitude modulation 4 (PAM4) signal of a known pattern as a test signal to a device under test (W), receives a signal from the device under test with the input of the test signal, and measures whether or not a forward error correction (FEC) operation of the device under test is possible based on a comparison result of the received signal and the test signal, the error rate measuring apparatus comprising:

an operation unit that sets a codeword length of the FEC, an FEC symbol length, and an FEC symbol error threshold in accordance with a communication standard of the device under test;

error counting means for counting an FEC symbol error detected at one FEC symbol interval between most significant bit string data and least significant bit string data of symbol string data obtained by receiving and converting the signal from the device under test based on a comparison result of error data and each of the most significant bit string data and the least significant bit string data of the symbol string data, and for counting the FEC symbol error as an uncorrectable codeword that is not capable of being forward error corrected when the number of the FEC symbol error in one codeword exceeds the FEC symbol error threshold;

a display unit that identifies and displays the symbol string data according to presence or absence of the FEC symbol error in FEC symbol length units based on a counting result of the error counting means; and display control means for performing display control by setting one zone of a display area of identification display of the display unit as one FEC symbol length, matching a length of a horizontal axis of the display area with one codeword length, and performing line feed in codeword length units so that a head of one codeword of the identification display is located at a left end of the display area and a tail of one codeword of the identification display is located at a right end of the display area.

3. The error rate measuring apparatus according to claim 2, wherein the display unit has a display area having a plurality of rows, which is numbered corresponding to each row of the identification display and is linked to scroll display of the identification display, and the display control means sets the codeword on a row in which the number of the FEC symbol errors in one codeword exceeds the FEC symbol error threshold as the uncorrectable codeword, and controls the display unit to identify and display the display area on the row corresponding to the uncorrectable codeword.

4. The error rate measuring apparatus according to claim 3, wherein the display control means controls the display unit to display a totalization result by a total number of the codewords and the number of the uncorrectable codewords.

5. A codeword error display method for an error rate measuring apparatus that inputs a non return to zero (NRZ) signal of a known pattern as a test signal to a device under test (W), receives a signal from the device under test with the input of the test signal, and measures whether or not a forward error correction (FEC) operation of the device under test is possible based on a comparison result of the received signal and the test signal, the codeword error display method comprising:

a step of setting, by an operation unit, a codeword length of the FEC, an FEC symbol length, and an FEC symbol error threshold in accordance with a communication standard of the device under test;

a step of counting, by error counting means, an FEC symbol error detected at one FEC symbol interval based on a comparison result of error data and each bit of bit string data obtained by receiving and converting the signal from the device under test;

a step of counting, by the error counting means, the FEC symbol error as an uncorrectable codeword that is not capable of being forward error corrected when the number of the FEC symbol errors in one codeword exceeds the FEC symbol error threshold;

a step of identifying and displaying, on a display unit, the symbol string data according to presence or absence of the FEC symbol error in FEC symbol length units based on a counting result of the error counting means; and a step of performing, by display control means, display control by setting one zone of a display area of identification display of the display unit as one FEC symbol length, matching a length of a horizontal axis of the display area with one codeword length, and performing line feed in codeword length units so that a head of one codeword of the identification display is located at a left end of the display area and a tail of one codeword of the identification display is located at a right end of the display area.

6. A codeword error display method for an error rate measuring apparatus that inputs a pulse amplitude modulation 4 (PAM4) signal of a known pattern as a test signal to a device under test (W), receives a signal from the device under test with the input of the test signal, and measures whether or not a forward error correction (FEC) operation of the device under test is possible based on a comparison result of the received signal and the test signal, the codeword error display method comprising:

a step of setting, by an operation unit, a codeword length of the FEC, an FEC symbol length, and an FEC symbol error threshold in accordance with a communication standard of the device under test;

a step of counting, by error counting means, an FEC symbol error detected at one FEC symbol interval between most significant bit string data and least significant bit string data of symbol string data obtained by receiving and converting the signal from the device under test based on a comparison result of error data and each of the most significant bit string data and the least significant bit string data of the symbol string data;

a step of counting, by the error counting means, the FEC symbol error as an uncorrectable codeword that is not capable of being forward error corrected when the number of the FEC symbol errors in one codeword exceeds the FEC symbol error threshold;

a step of identifying and displaying, on a display unit, the symbol string data obtained by receiving and converting the signal from the device under test according to presence or absence of the FEC symbol error in FEC symbol length units; and a step of performing, by display control means, display control by setting one zone of a display area of identification display of the display unit as one FEC symbol length, matching a length of a horizontal axis of the display area with one codeword length, and performing line feed in codeword length units so that a head of one codeword of the identification display is located at a left end of the display area and a tail of one codeword of the identification display is located at a right end of the display area.

7. The codeword error display method according to claim 6, further comprising:

a step of displaying, on the display unit, a display area having a plurality of rows, which is numbered corresponding to each row of the identification display and is linked to the scroll display of the identification display; and a step of, by the display control means, setting the codeword on a row in which the number of the FEC symbol errors in one codeword exceeds the FEC symbol error threshold as the uncorrectable codeword, and controlling the display unit to identify and display the display area on the row corresponding to the uncorrectable codeword.

8. The codeword error display method according to claim 7, further comprising:

a step of controlling, by the display control means, the display unit to display a totalization result by a total number of the codewords and the number of the uncorrectable codewords.

* * * * *